US012578361B2

(12) United States Patent
Liu et al.

(10) Patent No.: US 12,578,361 B2
(45) Date of Patent: Mar. 17, 2026

(54) INTEGRATED MULTI-COMPONENT HALL EFFECT SENSOR

(71) Applicant: SEMICONDUCTOR COMPONENTS INDUSTRIES, LLC, Scottsdale, AZ (US)

(72) Inventors: Gang Liu, Camas, WA (US); Santosh Menon, Portland, OR (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 140 days.

(21) Appl. No.: 18/435,393

(22) Filed: Feb. 7, 2024

(65) Prior Publication Data

US 2025/0251427 A1     Aug. 7, 2025

(51) Int. Cl.
| | |
|---|---|
| *G01R 15/20* | (2006.01) |
| *H10N 52/00* | (2023.01) |
| *H10N 52/01* | (2023.01) |

(52) U.S. Cl.
CPC ........... *G01R 15/202* (2013.01); *H10N 52/01* (2023.02); *H10N 52/101* (2023.02)

(58) Field of Classification Search
CPC ..... G01R 15/202; H10N 52/01; H10N 52/101
See application file for complete search history.

(56) References Cited

U.S. PATENT DOCUMENTS

| | | | | |
|---|---|---|---|---|
| 5,652,445 | A * | 7/1997 | Johnson | H03K 19/18 |
| | | | | 365/170 |
| 6,049,496 | A * | 4/2000 | Forbes | G11C 7/062 |
| | | | | 365/208 |
| 10,050,082 | B1 * | 8/2018 | Liu | H01L 21/76224 |
| 2010/0133632 | A1 | 6/2010 | Schott | |
| 2010/0252900 | A1 | 10/2010 | Minixhofer et al. | |
| 2016/0018478 | A1 * | 1/2016 | Hebert | G01R 33/0052 |
| | | | | 257/421 |
| 2017/0191952 | A1 * | 7/2017 | Blease | G01N 33/0031 |
| 2018/0149713 | A1 * | 5/2018 | Latham | G01R 33/0047 |
| 2020/0027813 | A1 * | 1/2020 | Cheah | H01L 23/5389 |
| 2020/0371168 | A1 * | 11/2020 | Van Der Wiel | G01R 33/0011 |

OTHER PUBLICATIONS

Gang Liu et al., "BCD Integrated Circuit Manufacturing Method Enabling Low-Cost Embedded Nonvolatile Memory," U.S. Appl. No. 18/515,968, filed Nov. 21, 2023, 21 pages.

* cited by examiner

*Primary Examiner* — Dominic E Hawkins
(74) *Attorney, Agent, or Firm* — Ramey LLP

(57)     ABSTRACT
Illustrative multi-component Hall effect sensors and sensing methods are suitable for embedding within integrated circuitry. One illustrative integrated circuit device includes: a substrate comprising a semiconductive body material with an upper surface; a focus contact on the upper surface that connects via an electrically isolated path to a embedded current focus within the body material; one or more distributed current contacts on the upper surface that operate in combination with the embedded current focus to form a distributed current flow through the body material; and an arrangement of sensing contacts on the upper surface to detect a set of voltages representing a Hall effect measurement for each three dimensional vector component of a magnetic field acting on the distributed current flow.

20 Claims, 7 Drawing Sheets

100

ANALOG (BIPOLAR) 102

PWR MGT (DMOS) 104

DIGITAL (CMOS) 106

SENSOR 108

101

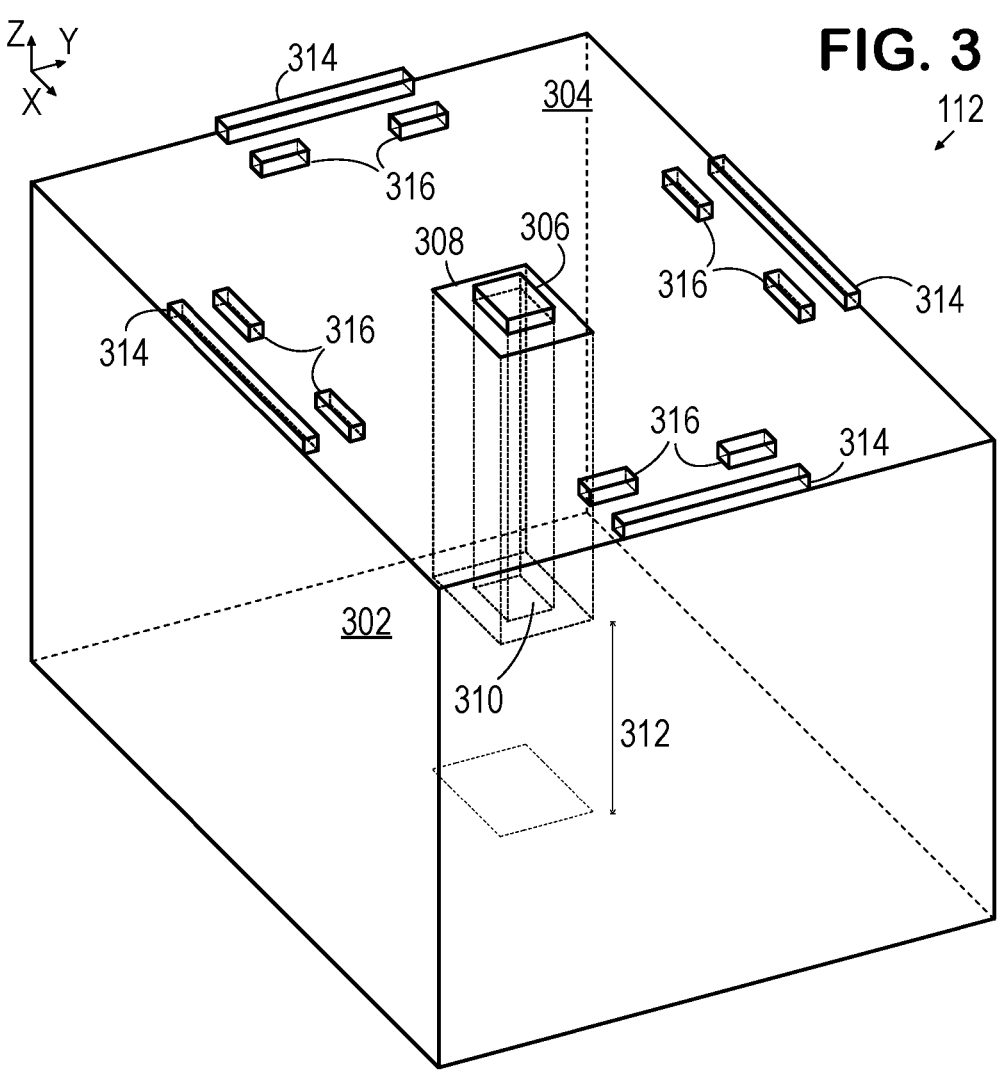
FIG. 3
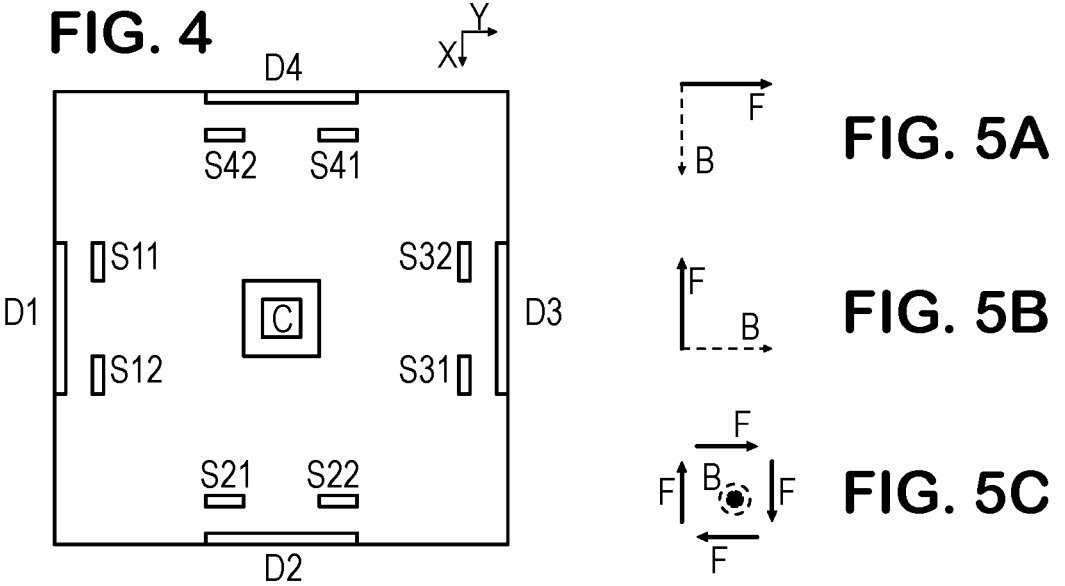
FIG. 4
FIG. 5A
FIG. 5B
FIG. 5C

902 p

906 p

908

902 p n          904 p

INTEGRATED MULTI-COMPONENT HALL EFFECT SENSOR

TECHNICAL FIELD

The present disclosure relates in general to integrated circuit electronics and, more particularly, to a multi-component Hall effect sensor and sensing method suitable for embedding within integrated circuitry of a semiconductor chip.

BACKGROUND

The manufacturing process for integrated circuits involves the application of repeated patterning, deposition, and etching steps to a semiconductor wafer or other substrate to form interconnected structures that operate as analog and/or digital components of an electronic circuit. Integrated circuits can be made more versatile, and thus more valuable, with the embedding of sensing technologies, particularly those that can be incorporated by adapting existing steps of the manufacturing process, thereby avoiding any significantly increased manufacturing costs. Such embedding may necessitate a compact sensor implementation using existing process steps.

SUMMARY

Accordingly, there are disclosed herein illustrative multi-component Hall effect sensors and sensing methods suitable for embedding within integrated circuitry, as well as illustrative integrated circuit manufacturing methods that may enable embedding of such sensors and sensing methods.

One illustrative integrated circuit device includes: a substrate comprising a semiconductive body material with an upper surface; a focus contact on the upper surface that connects via an electrically isolated path to a embedded current focus within the body material; one or more distributed current contacts on the upper surface that operate in combination with the embedded current focus to form a distributed current flow through the body material; and an arrangement of sensing contacts on the upper surface to detect a set of voltages representing a Hall effect measurement for each three dimensional vector component of a magnetic field acting on the distributed current flow.

An illustrative sensing method includes forming a distributed current flow between an embedded current focus and one or more distributed current contacts on a surface of a body, the distributed current flow exhibiting a Hall effect when acted on by a magnetic field; and detecting a set of voltages with an arrangement of sensing contacts on the surface of the body. The arrangement provides distinguishable sensitivities to the Hall effect induced by two components of the magnetic field parallel to the surface and by the component of the magnetic field perpendicular to the surface.

An illustrative sensor manufacturing method includes: forming an electrically isolated path to an embedded current focus within a semiconductive body material having an upper surface; and providing a set of contacts on the surface. The set of contacts includes: a focus contact connected via the electrically isolated path to the embedded current focus; one or more distributed current contacts configured to form distributed current flow through the body material to or from the embedded current focus; and multiple sensing contacts configured to provide voltages sensitive to a Hall effect measurement for each three-dimensional vector component of a magnetic field acting on the distributed current flow.

Each of the foregoing can be employed individually or in conjunction and may include one or more of the following optional features in any suitable combination: 1. the semiconductive body material is one of: a bulk material of the substrate; an electrically isolated epitaxial material on the substrate; and an electrically isolated semiconductor well. 2. the semiconductive body material is electrically isolated from substrate bulk material using at least one of trench isolation and a reverse-biased P-N junction. 3. the electrically isolated current path is electrically isolated from body material using at least one of trench isolation and a reverse-biased P-N junction. 4. the electrically isolated current path extends at least five microns perpendicular to the surface. 5. the one or more distributed current contacts are each separated from the focus contact by at least three microns. 6. the arrangement of sensing contacts is located between the focus contact and the one or more distributed current contacts. 7. the arrangement of sensing contacts and the one or more distributed current contacts each have four-fold rotational symmetry around the focus contact. 8. the semiconductive body material is substantially homogeneous. 9. the semiconductive body material has at least one of apertures or isolative barriers to enhance sensitivity of the Hall effect measurements. 10. the semiconductive body material has a square mesh configuration with at least eight apertures around a filled center containing the embedded current focus. 11. the square mesh configuration includes trenches extending diagonally from the electrically isolated current path to an outer perimeter of the mesh. 12. the method includes converting the set of voltages into measurements of the two components of the magnetic field parallel to the surface and the component of the magnetic field perpendicular to the surface. 13. the method includes converting the set of voltages into a measurement of a magnitude of the magnetic field. 14. the measurement of magnitude is a binary value indicating the presence or absence of a magnetic field having a magnitude that exceeds a given threshold. 15. the distributed current flow is confined within a rectangular body region having a given depth and having said surface as a square. 16. the one or more distributed current contacts includes four edge contacts each proximate to a respective edge of the square. 17. the arrangement of sensing contacts includes four pairs of sensing contacts with each pair positioned between a focus contact and a respective one of the four edge contacts. 18. The sensing method of claim 15, wherein the arrangement of sensing contacts has two perpendicular mirror symmetries.

BRIEF DESCRIPTION OF THE DRAWINGS

FIG. 3 is an isometric view of a first illustrative multi-component Hall effect sensor transducer.

FIG. 4 is a plan view of the first illustrative multi-component Hall effect sensor transducer.

FIGS. 5A-5C are vector diagrams for single-component Hall effects.

DETAILED DESCRIPTION

Figure 1:
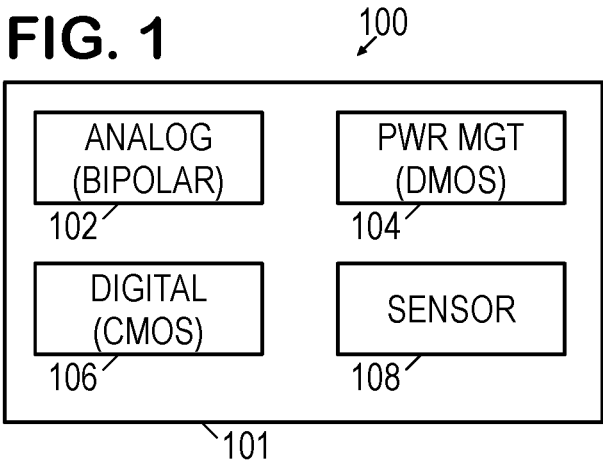
FIG. 1 is a block diagram of an illustrative BCD integrated circuit.

The following description and accompanying drawings are provided for explanatory purposes, not to limit the disclosure. To the contrary, they provide the foundation for one of ordinary skill in the art to understand all modifications, equivalents, and alternatives falling within the scope of the claims.

For simplicity and clarity of illustration, elements in the figures are not necessarily to scale, and the same reference characters in different figures denote the same elements. Additionally, descriptions and details of well-known steps and elements are omitted for simplicity of the description. Although the devices are explained herein as having certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

Herein, the term "oxide" is shorthand for silicon oxide, or more properly, silicon dioxide. "Nitride" may be used as a shorthand term for silicon nitride, or more properly, trisilicon tetranitride. "Silicide" may be used as a term for $WSi_2$, $TaSi_2$, $CrSi_2$, NiSi, or other metal-silicon compounds that can be deposited to act as surface contacts or as interfaces between exposed silicon and surface contacts that are metallic. As used herein, the term "vertical" means along the z-axis, which is typically oriented perpendicular to a surface of a substrate or device body. The term "horizontal" means along an axis perpendicular to the z-axis, and thus along an axis parallel to the surface of the substrate or device body. When this terminology is applied in a Cartesian coordinate system, the x-axis and y-axis are each horizontal.

FIG. 1 is a diagram of an illustrative BCD (Bipolar, CMOS, DMOS) integrated circuit 100 having a monolithic semiconductor substrate 101 hosting multiple semiconductor device technologies. The integrated circuit 100 may include analog circuitry 102 implemented using bipolar junction transistors and other bipolar junction devices (e.g., PN diodes, NPN transistors, PNP transistors, silicon controlled rectifiers, JFETs), power management circuitry 104 implemented using DMOS (double-diffused metal oxide semiconductor) devices, digital circuitry 106 implemented using MOS (metal oxide semiconductor) devices (e.g., NMOS, PMOS, CMOS), and one or more embedded sensors 108, which may be implemented with the same steps used for forming the other devices on the substrate 101. While the various device types may be isolated from each other with isolation trenches, buried layers, tubs, or other functionally similar isolation structures, they may be interconnected via suitably patterned metal or other conductive layers deposited on the substrate's surface as discussed further below.

Figure 2:
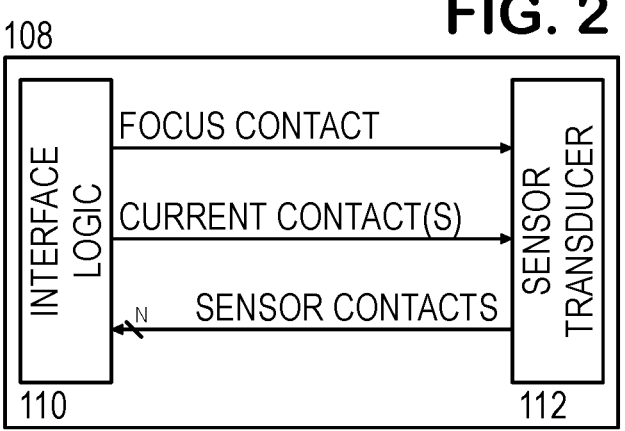
FIG. 2 is a block diagram of an illustrative integrated Hall effect sensor.

FIG. 2 is a block diagram of an illustrative embedded sensor 108 having an interface logic circuit 110 that controls various signal lines for a sensor transducer 112, enabling the interface logic 110 to acquire sensor measurements. In the present example, it is contemplated that the interface logic circuit 110 will provide a bias between the focus contact signal line and the current contact signal line to provide a distributed current within the sensor transducer. Measurements of the sensor contact signal line voltages can then be used to determine vector components of the magnetic field. The interface logic circuit 110 may include a current source to provide the desired bias and various buffers with high input impedances for detecting the sensing contact voltages. One or more comparators or analog to digital converters may be provided to convert the detected voltages into measurements of magnetic field components or the magnetic field magnitude.

FIG. 3 is an isometric view of an illustrative implementation of sensor transducer 112. It includes a volume of semiconductive body material 302 with an upper surface 304. The semiconductive body material 302 may be bulk substrate material but may preferably be an electrically isolated volume of semiconductive body material. Such isolation can be achieved, e.g., using a well or buried layer that is oppositely doped from the body material 302 to provide a PN junction that can be reverse biased to prevent current from escaping the isolated volume. Alternatively, the semiconductive body material 302 may be epitaxially deposited over an insulating layer or nonconductive substrate to prevent vertical current flow to or from the body material. To prevent horizontal current flow to or from the body material 302, the material may be surrounded by one or more isolation trenches that extend from the surface 304 to a buried layer or underlying insulator. Optionally, such isolation trenches can be filled with an oxide or other insulating material to enable conductive paths to be formed between surface contacts on the semiconductive body material 302 and elsewhere on the substrate. Such isolation structures are omitted from FIG. 3, but illustrative examples are described further below in connection with FIGS. 8 and 9D.

A focus contact 306 is provided in the middle of the surface 304. An isolation trench or other isolation structure 308 extends downward from around the focus contact 306, forming an electrically isolated path between the focus contact and an embedded current focus 310 positioned within the semiconductive body material 302. The embedded current focus 310 is an aperture formed by the isolation structure 308 to enable current flow between the electrically isolated path and the surrounding material 302. The electrically isolated path extends vertically from the upper surface 304, but as indicated by dimension line 312, the isolation structure 308 does not reach the isolation boundary below the semiconductive body material 302 as that would prevent current flow and thus fail to provide an embedded current focus 310. The interior of isolation structure 308 contains a conductive or semiconductive material to facilitate current flow along the electrically isolated path.

One or more distributed current contacts 314 is provided on the upper surface 304, operating in combination with the embedded current focus 310 to form a distributed current flow within the semiconductive body material 302. The distributed current flow includes current flow components along each of the x-, y-, and z-axes. In FIG. 3, four contacts 314 are provided, one along each edge of the square upper surface 304. An arrangement of sensing contacts 316 is also provided on the upper surface 304 to detect a set of voltages representing a Hall effect measurement for each three-dimensional vector component of a magnetic field acting on the distributed current flow.

In FIG. 4, the focus contact 306 is labeled "C". The four distributed current contacts 314 are labeled "D1", "D2", "D3", and "D4". A pair of sensing contacts 316 is provided between each distributed current contact 314 and the focus contact 306. The pair of sensing contacts "S11" and "S12" correspond to current contact D1; the pair of sensing contacts "S21" and "S22" correspond to current contact D2; pairs "S31", "S32", and "S41", "S42" correspond to current contacts D3 and D4, respectively. The current contacts may be electrically connected so as to have the same voltage, e.g., ground voltage. The voltages of sensing contact Sij is represented below as Vij, e.g., V31 is the voltage of sensing contact S31.

When the semiconductive body material 302 has p-type doping (causing valence band holes to act as the majority charge carriers), the focus contact 306 is biased positive relative to the distributed current contacts 314, causing the majority charge carriers to travel outward and upward from the embedded current focus 310. In this case, the sensing contacts 316 detect a positive voltage relative to the current contacts 314. When the semiconductive body material is n-doped (causing conduction band electrons to act as the majority charge carriers), the focus contact is biased negative relative to the distributed current contacts 314, again causing the majority carriers to travel outward and upward from the embedded current focus 310. In this case, the sensing contacts 316 detect a negative voltage relative to the current contacts 314. In the discussion below, we assume p-type doping, but the calculations of magnetic field strength and direction remain the same for both p-type and n-type semiconductive body material.

As indicated in FIG. 5A, a magnetic field oriented along the x-axis causes holes having a velocity component along the z-axis, i.e., traveling upward from the embedded current focus, to experience a force along the y-axis. This induces a Hall effect voltage proportional to the magnetic field strength: $B_x = k_x((V_{31}+V_{32})-(V_{11}+V_{12}))$. As indicated in FIG. 5B, a magnetic field oriented along the y-axis causes these holes to experience a force along the negative x-axis, similarly inducing a Hall effect voltage proportional to the magnetic field strength: $B_y = k_y((V_{41}+V_{42})-(V_{21}+V_{22}))$. As indicated in FIG. 5C, a magnetic field oriented along the z-axis causes holes having horizontal velocity component, i.e., traveling outward from the embedded current focus, to experience a force clockwise about the embedded current focus. This again induces a Hall effect voltage proportional to the magnetic field strength: $B_z = k_z((V_{11}-V_{12})+(V_{21}-V_{22})+(V_{31}-V_{32})+(V_{41}-V_{42}))$. In these equations, $k_x$, $k_y$, and $k_z$ are empirically determined constants of proportionality. It should be clear from these equations that this arrangement of sensing contacts provides distinguishable sensitivity to the Hall effect induced by the two components of the magnetic field parallel to the upper surface and to the component of the magnetic field perpendicular to the upper surface. These equations presume substantially linear behavior of the transducer; in practice it may be desirable to model the transducer response to varying field strengths and orientations to derive lookup tables or other representations of the relationship between the set of voltages and the desired magnetic field or Hall effect measurements.

The transducer dimensions are design parameters that are subject to change based on manufacturing constraints and desired sensitivity. FIG. 3 may represent one example in which the horizontal dimensions of the semiconductive body material 302 are 12 microns, the vertical dimension of the body material 302 is 10 microns, the horizontal dimensions of the isolated path are 1 micron, the width of the isolation trench around the isolated path is 0.5 micron, and the vertical dimension of the path and trench is 6 microns. The current contacts are centered on each edge with a length of 4 microns and a width of 0.3 micron. The sensor contacts each have a length of about 1 micron and width of 0.3 micron and may be spaced approximately 1 micron from the corresponding current contact. At least three microns of separation may be provided between the distributed current contacts and the focus contact, and the electrically isolated path may extend at lease five microns perpendicular to the upper surface. It is noted that these dimensions were employed to establish proof of concept, and it is expected that enhanced performance is achievable with further optimization.

Figure 6:
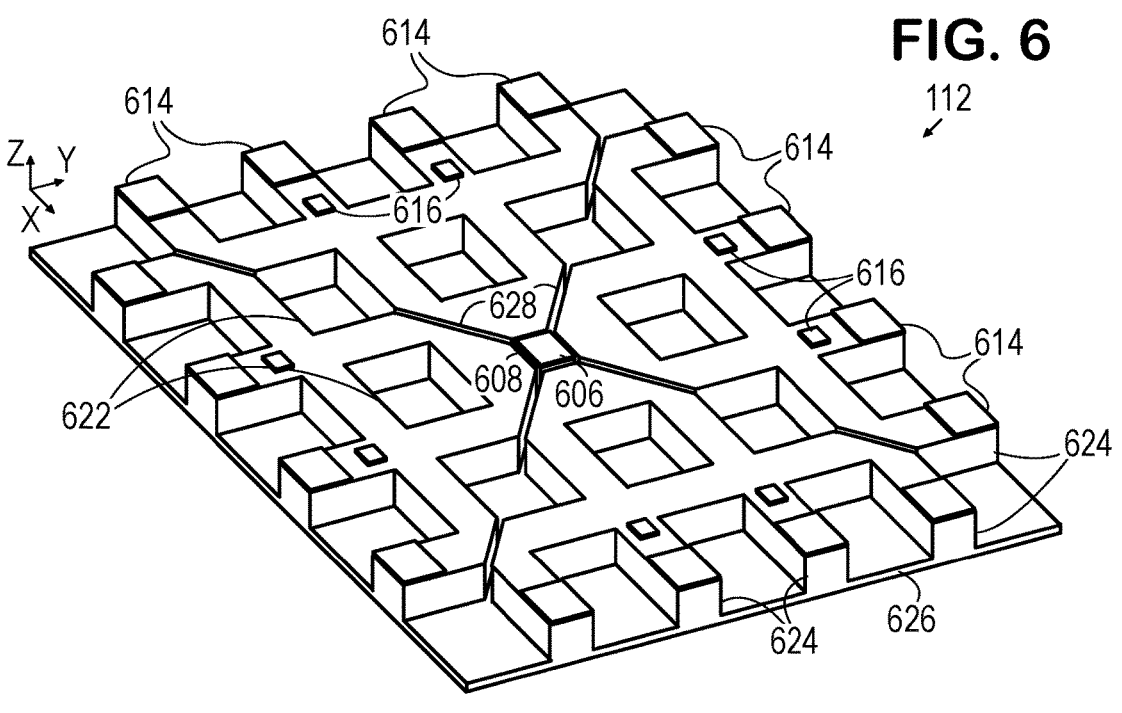
FIG. 6 is an isometric view of a second illustrative multi-component Hall effect sensor transducer.

In the example of FIG. 3, the semiconductive body material 302 is substantially homogeneous. This is not a requirement, and FIG. 6 shows an example of a transducer 112 which contains a pattern of at least eight recesses or filled apertures 622 around a filled center containing the embedded current focus. The apertures 622 form ridges 624 having a square mesh or "waffle" configuration. The apertures 622 act as barriers to restrict and shape the current flow, but the semiconductive body material may further include a floor 626 to enable to current flow beneath the apertures 622. In any event, currents preferentially flow along the ridges.

As with the FIG. 3 transducer, the FIG. 6 transducer includes a current focus contact 606 and an isolation trench or other isolation structure 608 that extends downward from around the focus contact to form an electrically isolated path to an embedded current focus. Majority current carriers travel upward and outward from the embedded current focus to reach the distributed current contacts 614 on each edge of the transducer. Diagonal trenches 28 may extend from the path isolation structure 608 to the outer perimeter of the square mesh at the corners of the semiconductive body material to enhance sensitivity to z-axis component of the magnetic field. Though not shown in FIG. 6, it is contemplated that the various apertures and trenches will be filled with an oxide or other insulating material, providing a smooth upper surface for supporting additional interconnect layers.

Figure 7:
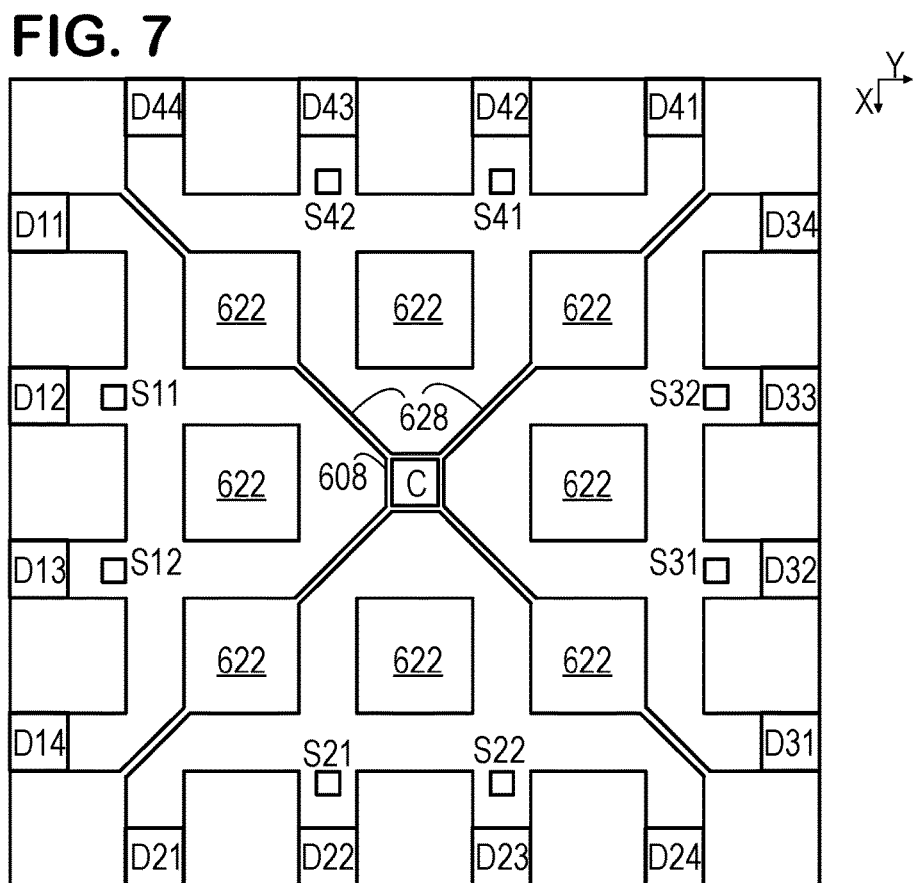
FIG. 7 is a plan view of the second illustrative multi-component Hall effect sensor transducer.

FIG. 7 is a plan view of the FIG. 6 transducer 112. The distributed current contacts 614 are labeled D11, D12, D13, D14 for the first edge, D21, D22, D23, and D24 for the second edge, D31, D32, D33, D34, for the third edge, and D41, D42, D43, and D44, for the fourth edge. As before, the distributed current contacts 614 may be interconnected and maintained at the same voltage. The sensing contacts 616 are labeled S11, S12 for the first edge, S21, S22, for the second edge, S31, S32 for the third edge, and S41, S42 for the fourth edge. The current focus contact 606 is labeled C. The same principles and equations apply as for the previous transducer example, though an enhanced sensitivity may be expected.

As before, the transducer dimensions are design parameters that are subject to change based on manufacturing constraints and sensitivity. FIG. 7 may represent an example in which the horizontal dimensions of the transducer are about 140 microns, with the ridges being about 10 microns wide and the apertures about 20 microns by 20 microns square. The current focus contact C may be 8 microns by 8 microns square, and the trenches 608, 628 may be about 1 or 2 microns wide. The vertical dimension of the semiconductive body material may be about 10 microns, the depth of the apertures 622 and trenches 608, 628 may be about 8 microns. The size and placement of the contacts may be parameters that are optimized empirically through, e.g., simulation.

The transducer examples provided herein each have a four-fold rotational symmetry (and mirror symmetry across two perpendicular axes), which may facilitate the derivation of magnetic field components from the sensing contact voltage measurements. Other symmetries would also be feasible, including three-fold rotational symmetry. Further simplification of the transducer geometry is possible, though such simplification may reduce sensitivity and/or increase complexity of the magnetic field component calculations. Instead of, or in addition to, measuring magnetic field components, the sensor transducer can be used to determine magnitude and direction of the magnetic field. In some contemplated examples, the calculated components or magnitudes may be compared to a threshold and a binary output used to indicate the presence or absence of field strength above the threshold.

Figure 8:
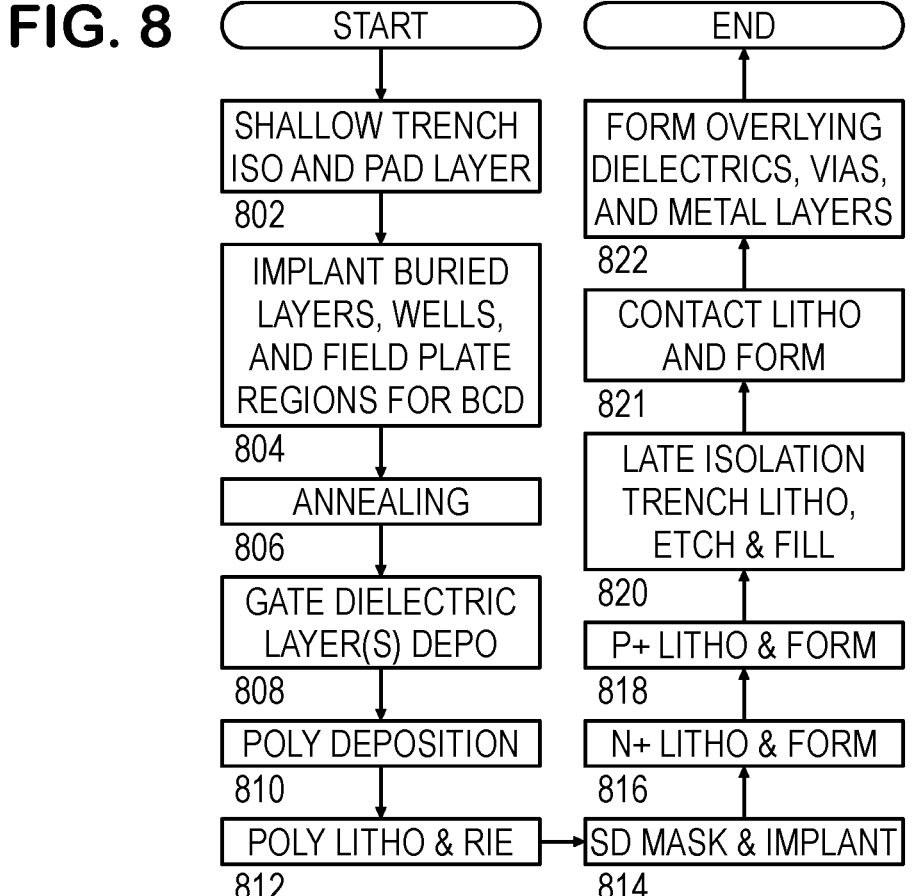
FIG. 8 is a flow diagram of an illustrative manufacturing method.
Figures 9A, 9B:
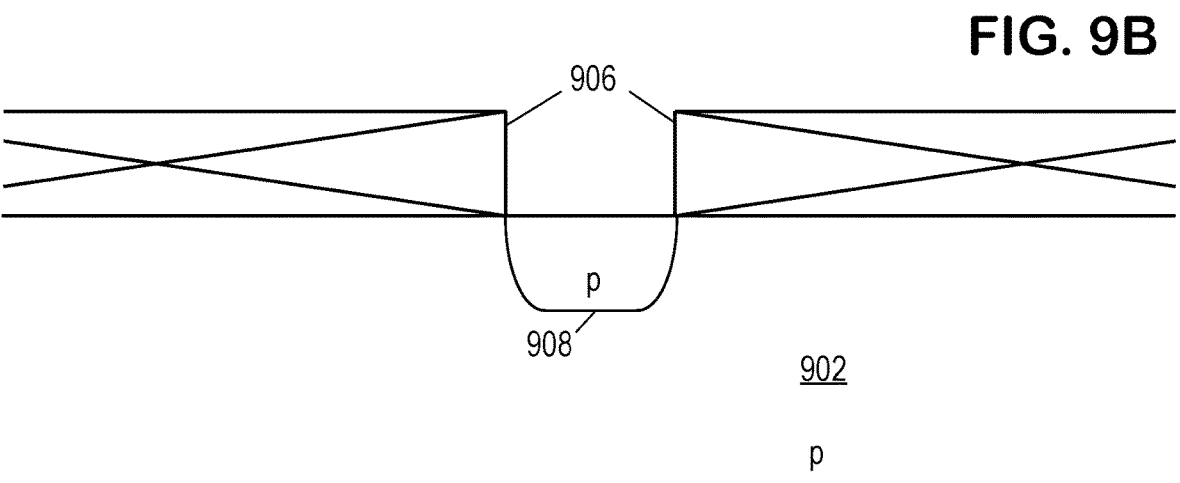
FIG. 9A is an illustrative initial cross-section.
FIG. 9B is an illustrative cross-section after step 806 of FIG. 8.

FIG. 8 is a flow diagram showing a sequence of process operations that may be used in an illustrative integrated circuit manufacturing method. As the various blocks are discussed, reference will be made to FIGS. 9A-9F which represent the formation of the sensor transducer via various steps of the method. These figures are not drawn to scale; certain dimensions are exaggerated for the purposes of illustrating certain features. FIG. 9A is a cross-section of a portion of a semiconductor wafer or other suitable substrate 902 before the manufacturing process begins. The substrate material may be a monocrystalline semiconductor material, a semiconductor-on-insulator substrate, a silicon layer over a glass plate, an epitaxial layer grown on a semiconductor substrate, a semiconductor material comprising a Group 14 element, e.g., carbon, silicon, germanium, or combinations thereof, or another semiconductor material conventionally used in the manufacture of semiconductor components. In accordance with an embodiment, the semiconductor material is lightly doped with an impurity material of p-type conductivity, i.e., a p-type dopant. Alternatively, the semiconductor material may be doped with an impurity material of n-type conductivity.

FIG. 8 shows a sequence of process operations 802-822 to provide bipolar devices, CMOS devices, and DMOS devices on a monolithic integrated circuit substrate. Some of these operations can be leveraged to manufacture a sensor transducer in a designated area of the substrate. It is expected that many existing processes can be adapted in this fashion to provide an integrated magnetic field sensor without requiring any additional masks, implants, or thermal budget.

The manufacturing process begins in block 802 with the formation of one or more shallow isolation structures, e.g., isolation trenches, between different regions of the semiconductor substrate to provide isolation between the multiple regions. Trenches may be formed between any adjacent regions to keep them electrically isolated. Isolation trenches may be formed using Shallow Trench Isolation (STI), deep trench isolation, or Local Oxidation of Silicon (LOCOS) techniques. During or after the trench formation, a thin pad layer is formed on the surface of the semiconductor substrate using, for example, a wet oxidation technique such as an in-situ steam generation (ISSG) operation. Though it may be preferred for the pad layer to be silicon oxide, in practice it can be any suitable dielectric material including, e.g., silicon nitride. In some cases, the pad layer may be supplemented with a stopping layer such as, for example, a polish-stop layer or an etch-stop layer, that are sequentially formed on or from the semiconductor substrate material using a thermal growth technique, a deposition technique, a combination of a thermal growth technique and a deposition technique or the like. The pad layer may be the same material as the stopping layer, or it may be a different material than the stopping layer.

In block 804, a deep ion implantation operation may be performed to create buried layers, wells, and field plates for those regions of the substrate that require such features, e.g., at least one well or buried layer in each of the at least one MOS device region and the nonvolatile memory region. Being able to form wells and buried layers in each of multiple regions is a benefit of the BCD process. Each feature type may be created using a corresponding photoresist layer coupled with a corresponding photolithography operation to pattern the layer, creating a mask with exposed areas that enable the implanted ions to reach only those areas where the features are desired. Thus, the buried layer 904 shown in FIG. 9B may be created using a buried n-layer mask that exposes the sensor transducer region and any other areas where a buried n-layer is desired. An n-well mask may be used to create n-wells in the bipolar region, the power region, and wherever else desired. A p-well mask 906 may be used to create p-well 908 in the sensor transducer region and wherever else desired. The buried layers, n-wells, and p-wells are doped with impurities ("dopants"), which may be implanted ions, that provide the desired conductivity type. The associated masks are each removed after use.

These deep implantation operations may be followed with an annealing cycle 806 to enable the dopants to integrate with the crystallographic structure of the substrate while also healing dislocations and other crystallographic damage caused during the implantation process. In block 808, the pad layer may be removed using, e.g., a wet etch, before a new pad oxide or other suitable gate dielectric layer is deposited over the exposed silicon surface of the substrate. A photolithography operation is performed, i.e., creation of a patterned mask layer with openings to enable removal of the new pad oxide or other suitable dielectric layer wherever the gate dielectric is not desired. The exposed dielectric layer regions are removed, and the patterned mask layer is stripped. These steps may be repeated to provide additional gate oxide or dielectric layers where different thicknesses are desired (e.g., for operation in different voltage regimes).

In block 810, a layer of doped polysilicon (short for polycrystalline silicon) or another suitably conductive gate material is deposited. In block 812, another photolithography operation is performed to pattern a layer of photoresist material, creating openings for removal of the gate material layer where no gates are desired. The removal may be performed using reactive ion etching. Collectively, blocks 808-812 are gate formation operations that serve to form gates over the gate dielectric layer at each location of MOSFET devices and DMOS devices. (The sensor transducer 112 does not include transistors and hence no gates are formed in the transducer area.)

After the photoresist is stripped, another photolithography operation is performed to create a source-drain mask in block 814, with openings to expose the areas where it is desired to provide transistor sources and drains or other shallow doped regions. Ion implantation may be used to create these shallow doped regions. The existing gate structures provide screening of the channel regions, enabling the source and drain regions to be self-aligned. Thereafter the mask is stripped and optionally followed by the deposition of a conformal oxide or suitable dielectric layer, e.g., on the order of 20 nm to 500 nm, to insulate the sides of the gate electrodes. If so, an etch or polishing operation may be performed to expose at least a portion of the upper surface of the gate electrodes.

In block 816, another photolithography operation is performed to create an n+ region mask, i.e., a patterned layer exposing those areas where it is desired to provide heavy n-type doping for ohmic contact between an n-type region and a conductive overlayer. An ion implantation operation may be performed to create these n+ ohmic regions.

Figures 9C, 9D:
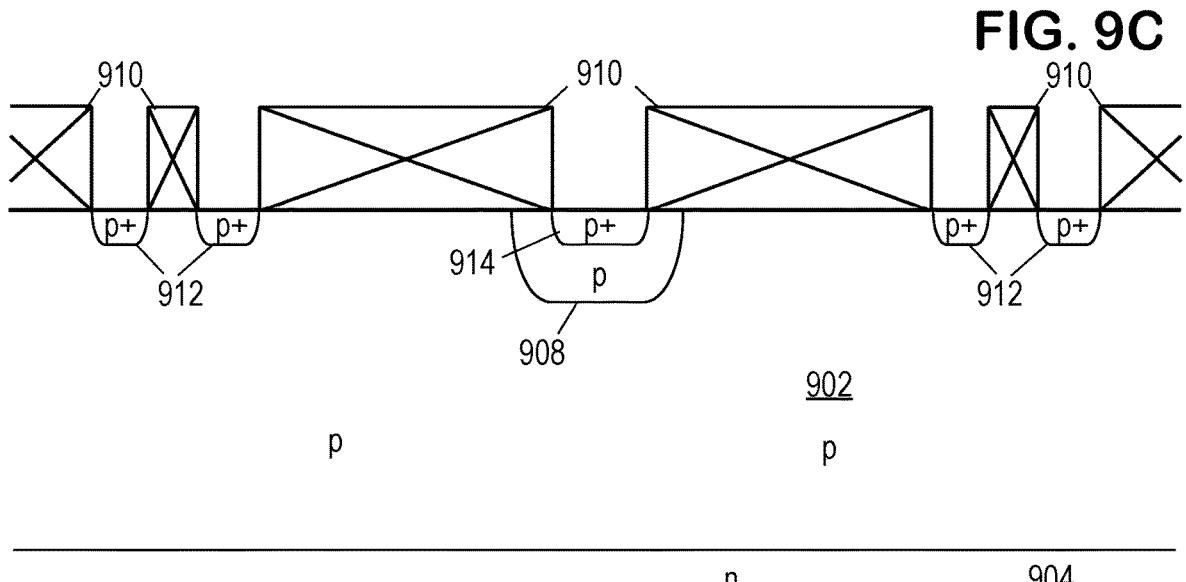
FIG. 9C is an illustrative cross-section after step 818 of FIG. 8.
FIG. 9D is an illustrative cross-section after step 820 of FIG. 8.

After stripping the patterned layer, in block 818, similar operations may be performed to form a p+ region mask 910 and provide heavy p-type doped regions 912, 914 as shown in FIG. 9C for ohmic contact between a p-type region and a conductive overlayer.

In block 820, another photolithography operation is performed with etching and oxidation to provide late trench isolation in a fashion similar to the operations of block 802. The trenches formed in block 820 may be wider and deeper than the shallow trenches of block 802, which could potentially cause issues with thermal expansion mismatches if performed earlier in the manufacturing process. FIG. 9D shows an isolation trench 916 extending downward from an upper surface and towards the buried layer 904 to define an embedded current focus 917 just above the buried layer 904, and a deeper isolation trench 918 that reaches the buried layer 904 to isolate the semiconductive body material 902 of the transducer from the bulk material of the substrate.

Figures 9E, 9F:
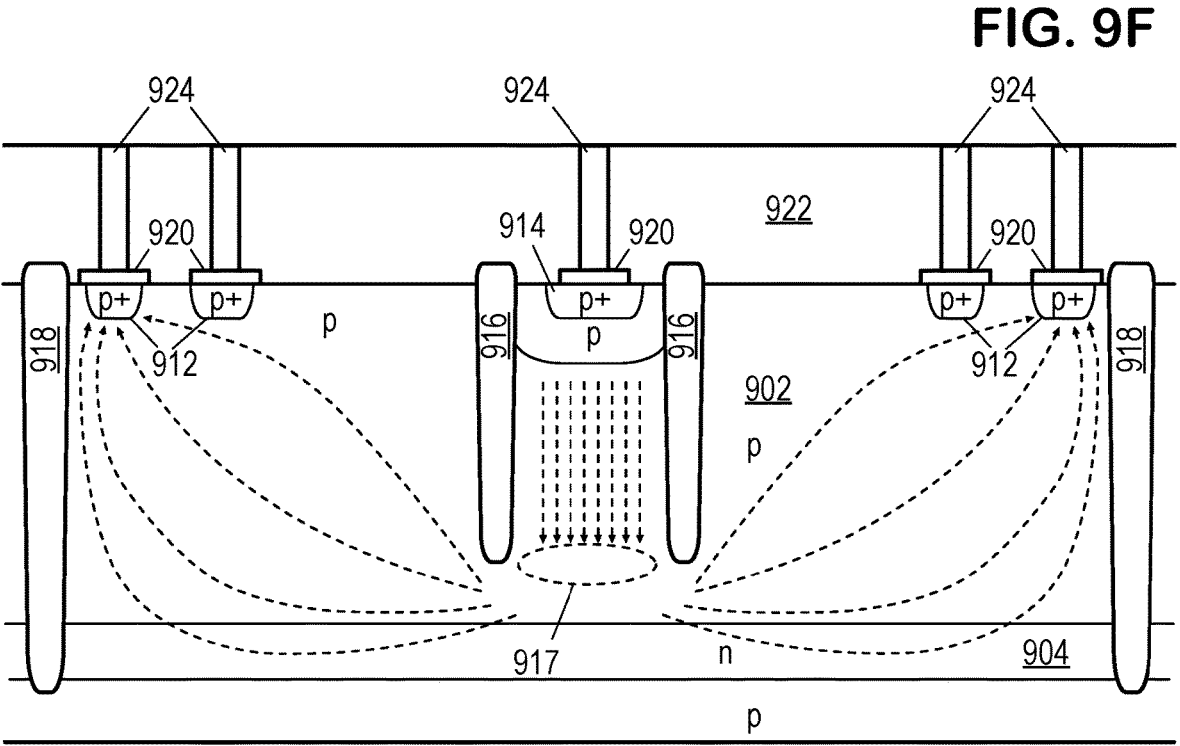
FIG. 9E is an illustrative cross-section after step 821 of FIG. 8.
FIG. 9F is an illustrative cross-section during step 822 of FIG. 8.

In block 821, conductive surface contacts 920 and gate contacts may be formed after a surface-exposing etch using a similar photolithography operation with a silicide, refractory metal (e.g., nickel, titanium, platinum, cobalt, tungsten, iridium) or other suitably conductive contact material as shown in FIG. 9E. These surface contacts 920 connect to the ohmic contacts in the transducer region and other device regions of the substrate.

Thereafter, in block 822, a thicker oxide or other suitable dielectric layer 922, e.g., on the order of 20 nm to about 500 nm, may be deposited and planarized before the formation and filling of vias 924 providing electrical connection to the surface contacts 920 as shown in FIG. 9F. The via filling may be performed concurrently with the deposition of a first layer of metal or other conductive material, which can be patterned using standard photolithography operations to form connections between the transistors and other devices formed in the substrate.

Additional layers and "metal" layers may be provided in block 822 before the formation of a final passivation layer with apertures for external connections to the integrated circuitry. Standard packaging techniques may be applied such as wire bonding to a lead frame during an encapsulation process, or multi-chip manufacturing in which the chip is bonded to another chip or an interposer that provides additional lead routing.

We note here that FIG. 9F also shown broken lines indicating a confined current flow within an electrically isolated path defined by trench 916 to reach the embedded current focus 917, and further indicating a distributed current flow from the embedded current focus 917. The distributed current flow is directed upward along the z-axis and outward along the x-and y-axes to reach the distributed current contacts. The broken lines indicate the movement of holes in the p-type semiconductive material. In an n-type semiconductive material, the majority carriers would be electrons moving upward and outward in this fashion. It is the effect of the magnetic field on this distributed current that gives rise to the set of voltages that can be detected by the sensing contacts and converted to measurements of the magnetic field.

What is claimed is:

1. An integrated circuit device that comprises:
   a substrate comprising a semiconductive body material with an upper surface;
   a focus contact on the upper surface that connects via an electrically isolated path to an embedded current focus within the body material;
   one or more distributed current contacts on the upper surface configured to operate in combination with the embedded current focus to form a distributed current flow through the body material; and
   an arrangement of sensing contacts on the upper surface configured to detect a set of voltages representing a Hall effect measurement for each three-dimensional vector component of a magnetic field acting on the distributed current flow.

2. The integrated circuit device of claim 1, wherein the semiconductive body material is one of: a bulk material of the substrate; an electrically isolated epitaxial material on the substrate; and an electrically isolated semiconductor well.

3. The integrated circuit device of claim 2, wherein the semiconductive body material is electrically isolated from substrate bulk material using at least one of trench isolation and a reverse-biased PN junction.

4. The integrated circuit device of claim 1, wherein the electrically isolated path is electrically isolated from body material using at least one of trench isolation and a reverse-biased P-N junction.

5. The integrated circuit device of claim 1, wherein the electrically isolated path extends at least five microns perpendicular to the upper surface.

6. The integrated circuit device of claim 1, wherein the one or more distributed current contacts are each separated from the focus contact by at least three microns, and the arrangement of sensing contacts is located between the focus contact and the one or more distributed current contacts.

7. The integrated circuit device of claim 1, wherein the arrangement of sensing contacts and the one or more distributed current contacts each have four-fold rotational symmetry around the focus contact.

8. The integrated circuit device of claim 1, wherein the one or more distributed current contacts comprises four distributed current contacts each defining an edge of a square around the focus contact, and wherein the arrangement of sensing contacts includes four pairs of sensing contacts with each pair positioned between the focus contact and a respective one of the four distributed current contacts.

9. The integrated circuit device of claim 1, wherein the semiconductive body material has a square mesh configuration with at least eight apertures around a filled center containing the embedded current focus.

10. The integrated circuit device of claim 9, wherein the square mesh configuration includes trenches extending diagonally from the electrically isolated path to an outer perimeter of the square mesh configuration.

11. A sensing method that comprises:

forming a distributed current flow between an embedded current focus and one or more distributed current contacts on a surface of a body, the distributed current flow exhibiting a Hall effect when acted on by a magnetic field; and detecting a set of voltages with an arrangement of sensing contacts on the surface of the body, the arrangement providing distinguishable sensitivities to the Hall effect induced by two components of the magnetic field parallel to the surface and by a component of the magnetic field perpendicular to the surface.

12. The sensing method of claim 11, further comprising: converting the set of voltages into measurements of the two components of the magnetic field parallel to the surface and the component of the magnetic field perpendicular to the surface.

13. The sensing method of claim 11, further comprising: converting the set of voltages into a measurement of a magnitude of the magnetic field.

14. The sensing method of claim 13, wherein the measurement of magnitude is a binary value indicating a presence or absence of a magnetic field having a magnitude that exceeds a given threshold.

15. The sensing method of claim 11, wherein the distributed current flow is confined within a rectangular body region having a given depth and having said surface as a square, wherein the one or more distributed current contacts includes four edge contacts each proximate to a respective edge of the square, and wherein the arrangement of sensing contacts includes four pairs of sensing contacts with each pair positioned between a focus contact and a respective one of the four edge contacts.

16. The sensing method of claim 15, wherein the arrangement of sensing contacts has two perpendicular mirror symmetries.

17. A sensor manufacturing method that comprises:

forming an electrically isolated path to an embedded current focus within a semiconductive body material having an upper surface; and providing a set of contacts on the upper surface, the set including:

a focus contact connected via the electrically isolated path to the embedded current focus;

one or more distributed current contacts configured to form distributed current flow through the body material to or from the embedded current focus; and multiple sensing contacts configured to provide voltages sensitive to a Hall effect measurement for each three-dimensional vector component of a magnetic field acting on the distributed current flow.

18. The sensor manufacturing method of claim 17, wherein the semiconductive body material is substantially homogeneous.

19. The sensor manufacturing method of claim 17, wherein the one or more distributed current contacts comprises four distributed current contacts each defining an edge of a square around the focus contact, and wherein the multiple sensing contacts include four pairs of sensing contacts with each pair positioned between the focus contact and a respective one of the four distributed current contacts.

20. The sensor manufacturing method of claim 17, further comprising providing the semiconductive body material with a square mesh configuration by forming at least eight apertures around a filled center containing the embedded current focus.

* * * * *